(12) United States Patent
Tsuda

(10) Patent No.: US 6,292,419 B2
(45) Date of Patent: Sep. 18, 2001

(54) SYNCHRONOUS SEMICONDUCTOR MEMORY DEVICE

(75) Inventor: Nobuhiro Tsuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/791,566

(22) Filed: Feb. 26, 2001

Related U.S. Application Data

(63) Continuation of application No. 09/231,870, filed on Jan. 14, 1999, now Pat. No. 6,208,576.

(30) Foreign Application Priority Data

Aug. 25, 1998 (JP) .................................................. 10-238767

(51) Int. Cl.[7] .................................................. G11C 7/00
(52) U.S. Cl. .................................................. 365/221; 365/233
(58) Field of Search ...................................... 365/221, 233

(56) References Cited

U.S. PATENT DOCUMENTS

| | | | |
|---|---|---|---|
| 5,384,745 | 1/1995 | Konishi et al. ....................... | 365/221 |
| 5,548,560 | 8/1996 | Stephen, Jr. et al. .............. | 365/233.5 |
| 5,742,317 | * 4/1998 | Kashihara ............................. | 347/131 |

OTHER PUBLICATIONS

Schell, Schneller, Cache, Synchrone SRAMS fur Cache–Anwendungen, Alan Burdis, Elecktronik 16/1994, pp. 78–82.

* cited by examiner

Primary Examiner—David Nelms
Assistant Examiner—M. Tran
(74) Attorney, Agent, or Firm—McDermott, Will & Emery

(57) ABSTRACT

The synchronous semiconductor memory device related to the present invention is a synchronous semiconductor memory device in which for one data read signal, the respective data corresponding to a plurality of addresses are sequentially read out from a memory cell in synchronism with an external clock signal, and which comprises a control circuit which executes control according to an externally inputted control signal so as to output only the data corresponding to one address from the memory cell for one data read signal.

9 Claims, 11 Drawing Sheets

Fig. 4A  IFT

Fig. 4B  CLK ① ②

Fig. 4C  SAC#

Fig. 4D  SACCLK

Fig. 4E  CE

Fig. 4F  SGW#

Fig. 4G  ADVCLK

Fig. 4K  OUTPUT SIGNAL1  ⟨ Ai ⟩⟨ Aj ⟩

Fig. 4L  OUTPUT SIGNAL2  ⟨ A0A1 ⟩⟨ /A0A1 ⟩

Fig. 4M  OUTPUT SIGNAL3  ⟨ AiA0A1 ⟩⟨ Aj/A0A1 ⟩

Fig. 4N  CLK2

Fig. 4O  R0  ⟨ A ⟩⟨ B ⟩

Fig. 4P  OUTPUT SIGNAL4  ⟨ A ⟩⟨ B ⟩

Fig. 4Q  Test OE  ←— Read —→←— Write —

Fig. 4R  Dout  ⟨ Dout ⟩

Fig. 4S  Din  ⟨ Din ⟩

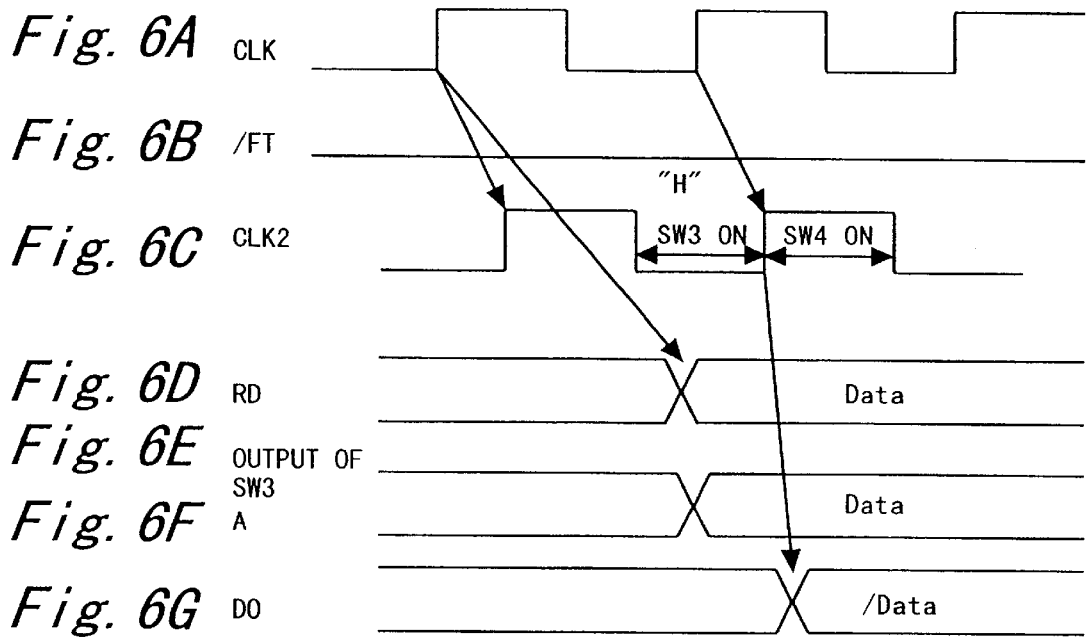
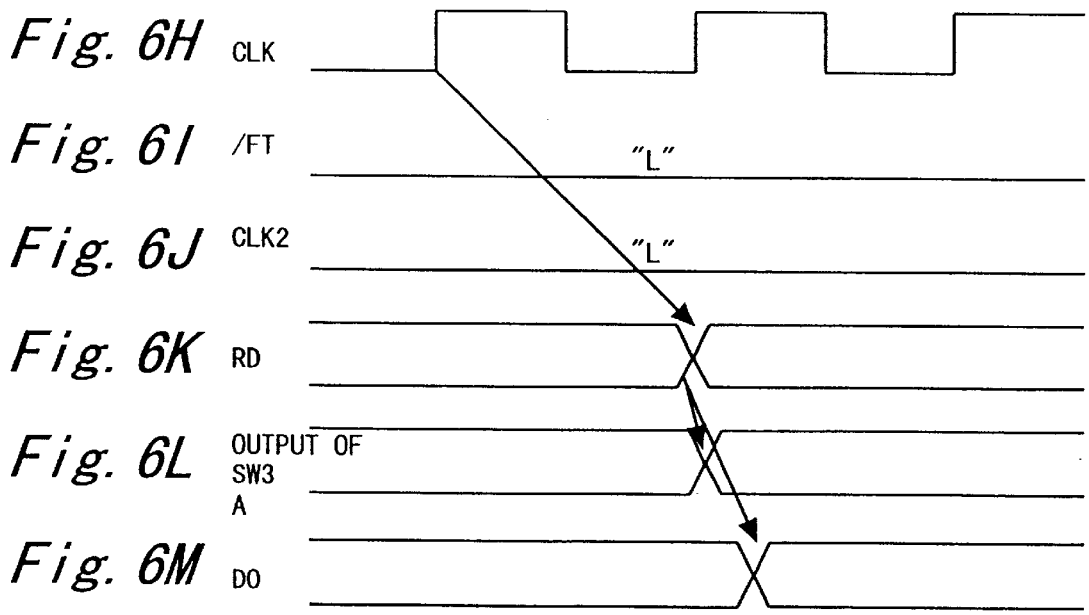

Fig. 10
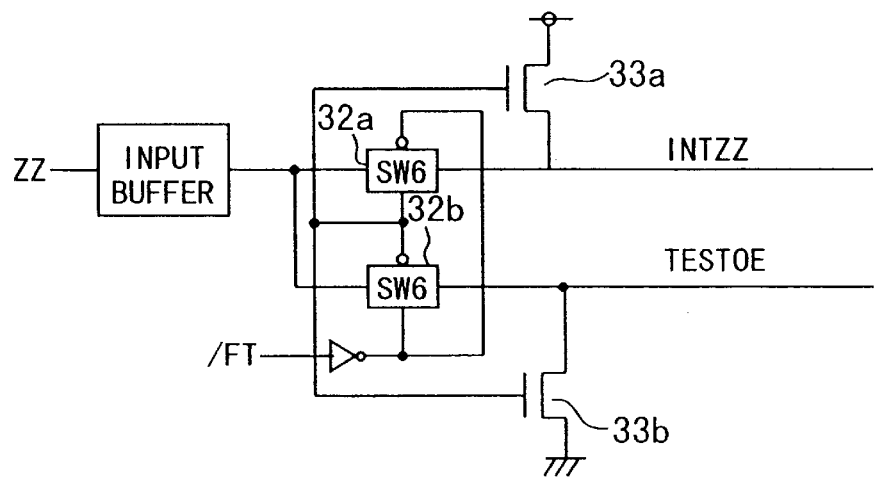
Fig. 11A   ZZ
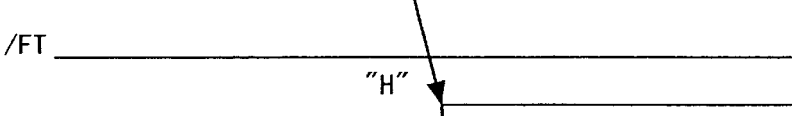
Fig. 11B   /FT
Fig. 11C   INTZZ
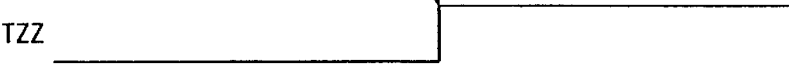
Fig. 11D   TFSTOE   "L"
(a)
Fig. 11E   ZZ
Fig. 11F   /FT   "L"
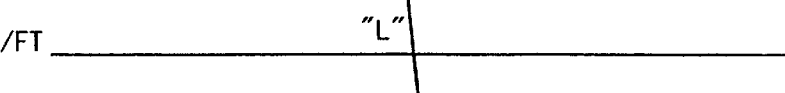
Fig. 11G   INTZZ
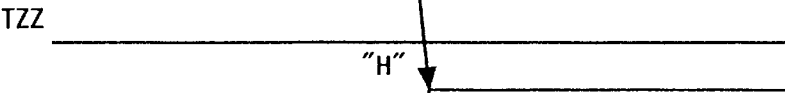
Fig. 11H   TFSTOE
(b)

SYNCHRONOUS SEMICONDUCTOR MEMORY DEVICE

This application is a Continuation of application Ser. No. 09/231,870 filed Jan. 14, 1999 now U.S. Pat. No. 6,208,576.

BACKGROUND OF THE INVENTION

1. Field of the Invention

The present invention generally relates to a synchronous semiconductor memory device which operates in synchronism with an external clock signal, and, more particularly, to a synchronous semiconductor memory device such as a pipeline burst SRAM in which the reading/writing of a plurality of data is performed.

2. Description of the Background Art

FIG. 12 is a block diagram showing a pipeline burst SRAM which is a former synchronous semiconductor memory device. In the figure, reference numeral 101 designates an address buffer for outputting to an address resistor 102 a plurality of address signals SA inputted from the outside, and address signals /SA obtained from the address signals SA. Reference numeral 102 designates an address register for holding the address signals SA and /SA inputted through the address buffer 101, and outputting the address signals SA and /SA to a decoder 106 in synchronism with a SAC clock signal (hereinafter referred to as SACCLK signal). Reference numeral 103 designates an address buffer for outputting externally inputted lowermost place address signals SA0 and SA1 to a counter 105.

104 is a counter enabling signal generator (ADV State Machine) for generating a counter enabling signal (hereinafter referred to as ADVCLK signal) synchronizing with an external clock signal. More particularly, the generator 104 generates the ADVCLK signal on the basis of a CE signal generated from external signals SE1, SE2, and SE3#, and the SACCLK signal, and outputting the ADVCLK signal to the counter 105. The generator 104, upon the inputting of a signal for data reading purpose (having a state in which the SACCLK signal takes an "H" value and the CE signal takes an "H" value), generates a ADVCLK signal in synchronism with an external clock signal input next to that generated at the time of the inputting of the data reading purpose signal. In addition, a similar ADVCLK signal is also generated when a signal for data writing purpose is inputted.

Reference numeral 105 designates a counter for outputting the lowermost place address signals inputted from the outside in synchronism with the SACCLK signal to the decoder 106, and outputting to the decoder 106 address signals corresponding to the lowermost place address signals in response to the ADVCLK signal generated in the counter enabling signal generator 104. Reference numeral 106 designates a decoder for generating instructions for data reading/writing or the like for the addresses obtained from the addresses outputted from the counter 105 and the address outputted from the address register 102.

Reference numeral 107 designates an SRAM core capable of information (data) reading or writing. The SRAM core 107 reads out data from a specified address or writes data to the specified address, in response to the instruction generated by the decoder 106.

Reference numeral 108 designates an output register for holding the data transmitted from the SRAM core 107 via a data bus RD, and outputting these data to an output buffer 110 in synchronism with the external clock signal. Reference numeral 109 designates an output enabling signal generator (OE State Machine) for outputting to an output buffer 110 as well as to an input buffer 111 an output enabling signal (hereinafter referred to as OE signal) synchronizing with the external clock signal generated on the basis of the external signal CE and the SACCLK signal. Reference numeral 110 designates an output buffer for outputting data transmitted from the output register 108 to the outside in response to the OE signal.

Reference numeral 111 designates an input buffer for taking from outside data to be inputted to the SRAM core 107 upon receipt of the OE signal. Reference numeral 112 designates an input register for holding data input from the outside through the input buffer 111, and inputting the holding data to the SRAM core 107 in synchronism with the external clock signal.

Now, the operation of the former synchronous semiconductor memory device is described.

In a case of an operation for reading out data at a specified address to the outside from the SRAM core 107, the signal for data reading purpose (hereinafter referred to as read signal) is input from the outside. (That is, data is read out when SACCLK, SGW#, and CE obtained from SE1, SE2, and SE3# becomes signals for reading.) The pulse of the external clock signal at the time of the inputting of the read signal is named as the 1st pulse, and the pulses subsequently generated by the external clock signal are named as the 2nd pulse, the 3rd pulse hereunder.

When such read signal is externally inputted, the counter enabling signal generator circuit 104 generates an ADVCLK signal having three pulses respectively synchronizing with the 2nd, 3rd, and 4th pulses of the external clock signal, and outputs the ADVCLK signal to the counter 105.

Upon the inputting of the read signal, the counter 105 outputs to the decoder 106, the lowermost place address signals input from the outside in synchronism with the SACCLK signal consisting of a pulse synchronized with the 1st pulse of the external clock signal. The counter 105 also sequentially outputs the addresses corresponding the lowermost address signals to the decoder 106 in synchronism with the pulse of the ADVCLK signal. Through such operation of the counter 105, in response to one read signal for data reading purpose, four mutually related addresses are sequentially sent to the decoder 106 in synchronism with the external clock signal.

The decoder 106 determines memory selection lines in the SRAM core 107 according tb the address signals inputted from the counter 105 and the address signals inputted from the address register 102, and sends an instruction to the SRAM core 107 for reading the data stored at locations corresponding to the selection lines. The SRAM core 107 responds to such instruction to output the data stored at the corresponding locations to the output resistor 108 via the data bus RD.

The output register 108 outputs the data inputted via the data bus RD to the output buffer 110 in synchronism with the external clock signal. The output buffer 110 outputs the data held in the output register 108 to the outside in response to the OE signal.

In the former memory device, the OE signal is generated in the output enabling signal generator circuit 109 in response to the read signal or the signal for data writing purpose (hereinafter referred to as write signal) so as to be in synchronism with a predetermined external clock signal.

In a data writing operation, data inputted from the outside (i.e., from DINDOUT terminal) in response to a write signal is inputted to the input register 112, which inputs the data to the SRAM core 107 in synchronism with the external clock signal. In this operation, a location for writing is inputted in a manner similar to that described in the above reading operation, whereby the above data is made to be written to this location.

In this specification, the symbol "/" represents the negative value of a signal as /A means the negative value of a signal A. Particularly, "#" is used instead of "/" with regard to the terminal of a synchronous semiconductor memory device.

The former synchronous semiconductor memory device constructed as described above, for one read signal, sequentially outputs data corresponding to an external address and a plurality of addresses relative to the external address. Similarly, the former device, for one write signal, continuously takes data corresponding to an external address and a plurality of addresses according to the external address.

The former synchronous semiconductor memory device outputs (or takes) data regarding to a plurality of related addresses for one read (or write) signal even in a test operation. In other wards, the former device cannot outputs (or takes) data only solely relating to a single address. Thus, data regarding only an individual address cannot be directly tested in the former device. As a result, there may arise a problem in which a test between two data at two addresses cannot be performed except for data to be continuously outputted, whereby the defect in such portion cannot be checked.

Further, since the former synchronous semiconductor memory device operates very differently from a general-purpose memory such as an asynchronous SRAM in which only data corresponding to one address is outputted (or inputted) for one read signal (or write signal), the test pattern and the test method which have been used in the test of the general-purpose memory cannot be used as well as the test method used for the general-purpose memory cannot be used. As a result, there also arises a problem that a test between given data cannot be readily performed.

In addition, the output buffer 110 outputs data to the outside in response to the OE signal generated by the output enabling signal generator 109 within the synchronous semiconductor memory device. The input buffer ill also takes data from the outside upon receipt of the OE signal generated in the output enabling signal generator 109 within the synchronous semiconductor memory device. Accordingly, even in a test operation, the data exchange between the outside and the inside of the synchronous semiconductor memory device is always synchronized with the external clock signal, which results in a problem that the outputting or inputting of data for a desired period of time with a desired timing cannot be performed.

SUMMARY OF THE INVENTION

The present invention has been conceived to solve the previously-mentioned problems, and a general object of the present invention is to provide a novel and useful synchronous semiconductor memory device.

A more specific object of the present invention is to provide a synchronous semiconductor memory device which enables the continuous outputting (inputting) of a plurality of data for one read (write) signal under the control of an external control signal, and also enables the outputting (inputting) of only one data according to an external address for one read (write) signal.

The above object of the present invention is achieved by a synchronous semiconductor memory device including a data processor circuit and a control circuit. The data processor circuit sequentially reads out from or writes to a memory cell respective data corresponding to a plurality of addresses in synchronism with a clock signal for one read signal or one write signal. The control circuit performs a control according to an external control signal which externally inputted so that only the data corresponding to one address is outputted from or inputted to the memory cell for the one read signal or the one write signal.

A further object of the present invention is to provide a synchronous semiconductor memory device which enables the data exchange between the outside and the inside of the synchronous semiconductor memory device with any timing under the control of an external control signal.

The above object of the present invention is achieved by a synchronous semiconductor memory device which includes an input/output circuit in addition to the data processor circuit and the control circuit. The input/output circuit controls data inputting/outputting between the memory cell and the outside according to an output enabling signal which is externally inputted.

Other objects and further features of the present invention will be apparent from the following detailed description when read in conjunction with the accompanying drawings.

BRIEF DESCRIPTION OF THE DRAWINGS

FIGS. 3A through 4S are timing charts for describing an operation of the synchronous semiconductor memory device shown in FIG. 2;

FIGS. 6A through 6M are timing charts for describing a normal operation and a test purpose operation of the output resistor shown in FIG. 5

FIG. 10 s a circuit diagram of the synchronous semiconductor memory device shown in FIG. 9;

FIGS. 11A through 11H are timing charts for describing a normal operation and a test purpose operation of the synchronous semiconductor memory device shown in FIG. 10.

DESCRIPTION OF THE PREFERRED EMBODIMENTS

Figure 1:
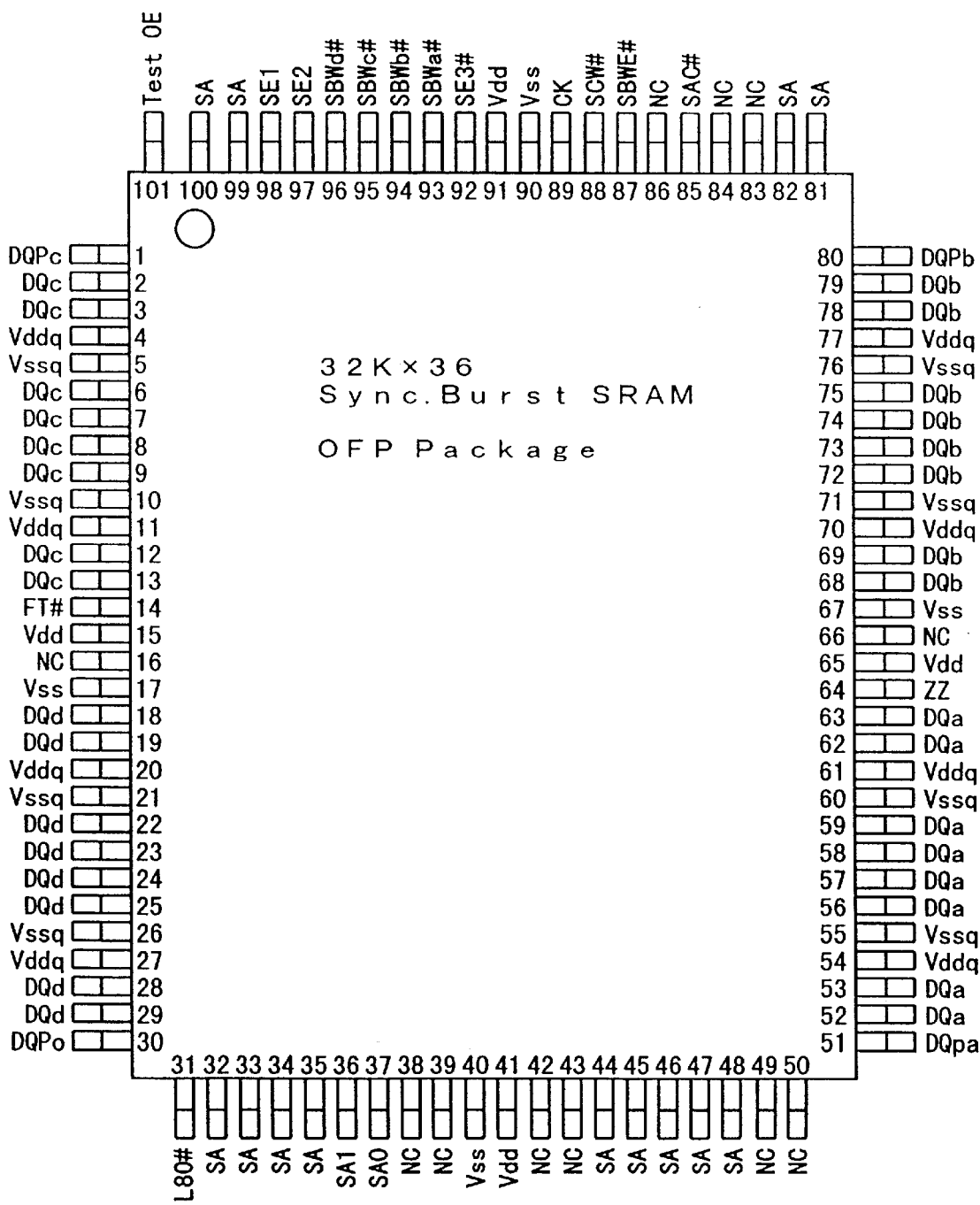
FIG. 1 is a plane view of a package of a synchronous semiconductor memory device practiced as a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

In the synchronous semiconductor memory device of this embodiment, data corresponding to a plurality of related addresses (e.g., four addresses) are sequentially read out (written) for one read (or write) signal during the normal operation synchronizing with external clock signals, so that data can be read or written at high speed. Conversely, the synchronous semiconductor memory device in the test operation, upon receipt of an external control signal, reads (or writes) only data corresponding to one address for one read (or write) signal.

Furthermore, in the normal operation, the data exchange between the outside and the inside of the synchronous semiconductor memory device is controlled by an output enabling signal (hereinafter referred to as OE signal) generated in the synchronous semiconductor memory device, while in the test operation, the data exchange between the outside and the inside of the synchronous semiconductor memory device is controlled by a Test OE signal inputted from the outside.

FIG. 1 is a plane view showing a QFP package of a synchronous semiconductor memory device practiced as the first embodiment of the present invention. 1. As shown in FIG. 1, this package is provided with terminals Vdd and Vddq to which a power supply signal is inputted; terminals Vss and Vssq to which a ground signal is inputted; terminals SA0 and SA1 to which lowermost place address signals are inputted; a terminal SA to which an address signal is inputted; terminals DQa, DQb, DQc, and DQd for inputting/outputting a data signal; terminals SE1, SE2, and SE3# to which chip enable signals are inputted; an external control signal input terminal FT# for taking an external control signal (hereinafter referred to as /FT signal) for controlling the data read/write method; and a terminal Test OE for taking a Test OE signal for controlling the data exchange between the outside and the inside of the package.

Figure 2:
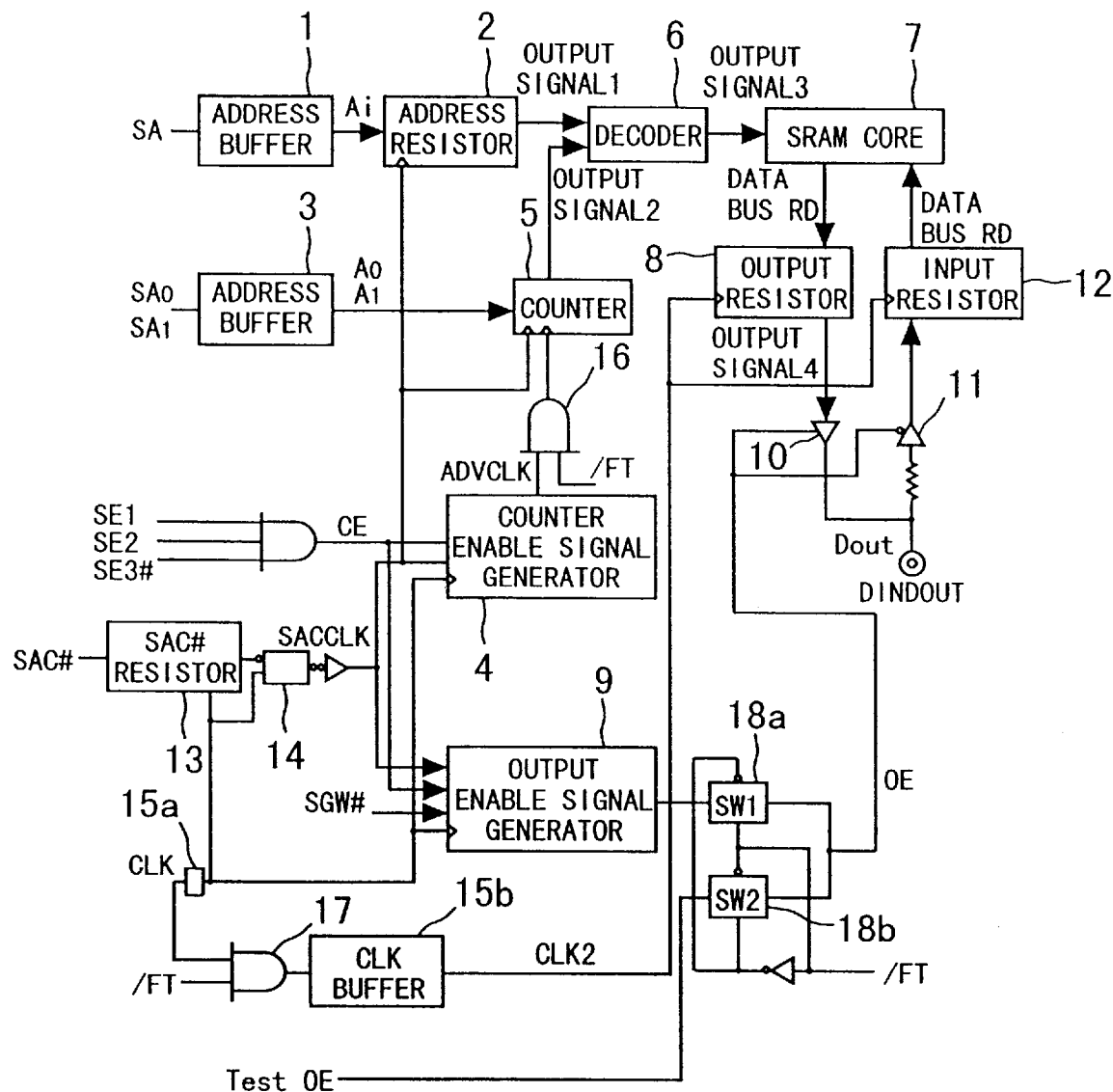
FIG. 2 is a circuit diagram of the synchronous semiconductor memory device practiced as a first embodiment of the present invention.

FIG. 2 is a block diagram showing inside of the package of the synchronous semiconductor memory device shown in FIG. 1. In FIG. 2, reference numeral 1 designates an address buffer for outputting an address signal Ai inputted from the terminal SA shown in FIG. 1 to an address register 2. The address resistor 2 holds the address signal Ai inputted from the terminal SA via the address buffer 1, and outputs the signal Ai to a decoder 6 in synchronism with an SACCLK signal (i.e., in synchronism with an external clock signal). Reference numeral 3 designates an address buffer for outputting lowermost address signals A0 and A1 inputted from the terminals SA0 and SA1 shown in FIG. 1 to a counter 5.

Reference numeral 4 designates a counter enabling signal generator (i.e., ADV State Machine) which is an address output portion for generating a counter enabling signal (hereinafter referred to as ADVCLK signal) synchronizing with an external clock signal, on the basis of a CE signal generated from external signals SE1, SE2, and SE3# inputted from the terminals SE1, SE2, and SE3# shown in FIG. 1, and the SACCLK signal, and outputting the ADVCLK signal to a counter 5. Upon an inputting of a signal for data reading purpose (which has a state in which the SACCLK signal has an "H" value and the CE signal has an "H" value), the generator 4 generates an ADVCLK signal including three pulses synchronizing with the three pulses sequentially generated following to the external clock signal at the time of the read signal inputting. A similar ADVCLK signal is also generated when a signal for data writing is inputted.

The reference numeral 5 designates a counter for outputting the lowermost place address signals inputted from the outside in synchronism with the SACCLK signal to a decoder 6, and outputting the address signals corresponding to the lowermost place address signals in response to the ADVCLK signal generated in the counter enabling signal generator 4 to the decoder 6. Reference numeral 6 designates a decoder for generating an instruction such as data read/write for a location determined from the address outputted from the counter 5 and the address outputted from the address register 2.

Reference numeral 7 designates an SRAM core on which a reading/writing of information (data) is allowed. The SRAM core reads data from or writes data at a specified address according to the instruction generated by the decoder 6.

Reference numeral 8 designates an output register for holding the data transmitted from the SRAM core 7 via a data bus RD, and outputting these data to an output buffer 10, synchronizing with the external clock signal in the normal operation, and without synchronizing with the external clock signal in the test operation. Reference numeral 9 designates an output enabling signal generator (i.e., OE State Machine) for outputting an output enabling signal (OE signal) synchronizing with the external clock signal, which is generated according to an external signal SGW#, and the CE and SACCLK signals. Reference numeral 10 designates an output buffer for outputting data transmitted from the output register 8 to the outside according to the OE signal in the normal operation, and according to the Test OE signal inputted from the terminal Test OE shown in FIG. 1 in the test operation.

Reference numeral 11 designates an input buffer for taking from outside data to be inputted to the SRAM core 7 according to the OE signal in the normal operation and according to the Test OE signal in the test operation. Reference numeral 12 designates an input register for holding data inputted from the outside via the input buffer 11, and inputting the held data to the SRAM core 7 via the data bus RD in synchronism with the external clock signal in the normal operation, and independently of the external clock signal in the test operation.

Reference numeral 13 designates an SAC# register for outputting an SAC# signal inputted from the terminal SAC# to an SAC clock generator circuit 14. Reference numeral 14 designates an SAC clock signal generator consisting of an NAND operation element to which the negation of the SAC# signal and a CLK signal are inputted, and an inverter circuit to which the signal outputted from the NAND operation element is inputted. Reference numerals 15a and 15b respectively designate CLK buffers for holding the external clock signal inputted from the outside, and outputting the external clock signal with a predetermined timing.

Reference numeral 16 designates an operation element for carrying out the logical AND between the ADVCLK signal and an external control signal /FT inputted from the external control signal input terminal FT# shown in FIG. 1. Reference numeral 17 designates an operation element for carrying out the logical AND between the external clock signal and the external control signal /FT inputted from the outside. Reference numeral 18a designates a switch (SW1) which takes an on-state when the external control signal /FT takes an "H" value and an off-state when the external control signal /FT takes an "L" value. Reference numeral 18b designates a switch (SW2) which takes an off-state when the external control signal /FT takes an "H" value and an on-state when the external control signal /FT takes an "L" value.

Now, the method for manufacturing the above synchronous semiconductor memory device is described.

Figure 12:
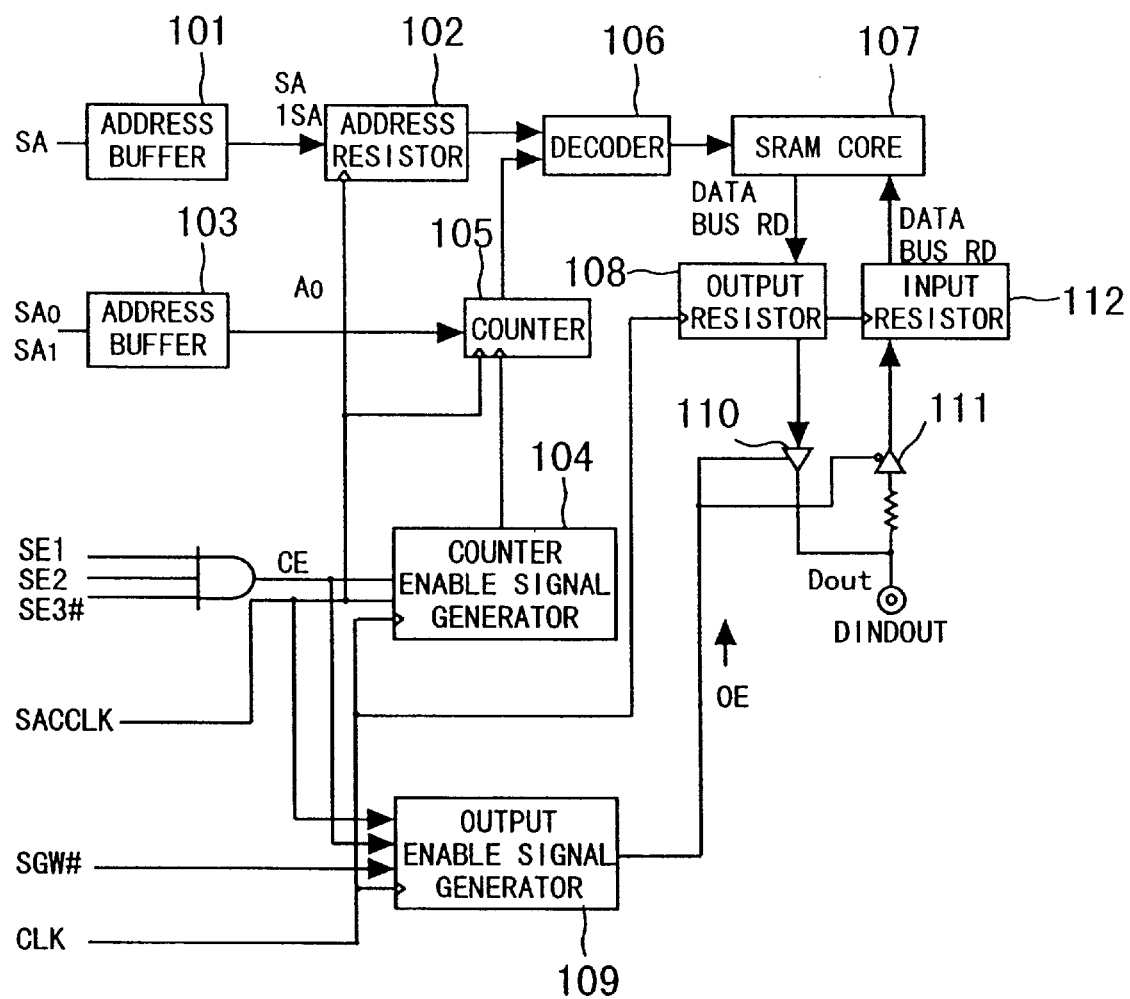
FIG. 12 is a circuit diagram of a former synchronous semiconductor memory device.

In a method for manufacturing the former synchronous semiconductor memory device, as shown in FIG. 12, a wiring connecting the counter enabling generator 104 and the counter 105 is formed. In the method for manufacturing the above synchronous semiconductor memory device, instead of the formation of the wiring, as shown in FIG. 2, the AND operation element 16 is formed between a wiring for inputting the ADVCLK signal to the counter 5, and the wiring is formed so that the ADVCLK signal is inputted to the counter 5 through the AND operation element 16, while a wiring is formed for connecting the input portion of the AND operation element 16 and the terminal FT# of the package of the synchronous semiconductor memory device.

Further, instead of forming the wiring connecting between the CLK signal and the output register 108 (or the input register 112) in the synchronous semiconductor memory device shown in FIG. 12, in the method for manufacturing the above device, as shown in FIG. 2, the AND operation element 17 is formed between the wiring for inputting the CLK signal to the output register 8 (or the input register 12), and the wiring is formed so that the CLK signal is inputted to the output register 8 (or the input register 12) through the AND operation element 17, as well as a wiring is formed so that the input portion of the AND operation element 17 and the terminal FT# of the package in the synchronous semiconductor memory device are connected to each other.

Moreover, in addition to such fabrication, instead of forming the wiring connecting the output enabling signal generator 109 and the output buffer 110 (or the input buffer 111) in the synchronous semiconductor memory device shown in FIG. 12, in the method for manufacturing the above device, the switches 18a (SW1) and 18b (SW2) and a wiring for connecting these switches to the output buffer 10 (or the input buffer 11) are formed in the wiring for inputting the OE signal to the output buffer 10 (or the input buffer 11), as shown in FIG. 2. Through the fabrication above, the synchronous semiconductor memory device according to the first embodiment is manufactured.

Now, the operation of the synchronous semiconductor memory device shown in FIG. 2 is described.

First, the normal operation of the device will be described. In the normal operation, the externally inputted /FT signal is always controlled to an "H" value. In a case where the /FT signal takes an "H" value, the operation element 16 directly output the inputted ADVCLK signal, the operation element 17 directly output the inputted external clock signal, and the switch 18a (SW1) takes an on-state whereas the switch 18b (SW2) takes an off-state, whereby the synchronous semiconductor memory device operates in a manner similar to the former synchronous semiconductor memory device shown in FIG. 12.

Figure 3A:
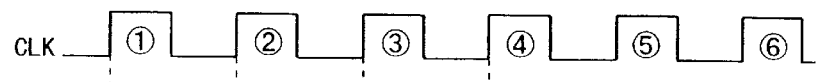
Figure 3B:
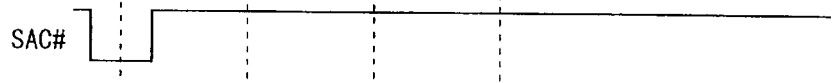
Figure 3C:
Figure 3D:
Figure 3E:
Figure 3F:
Figure 3G:
Figure 3H:
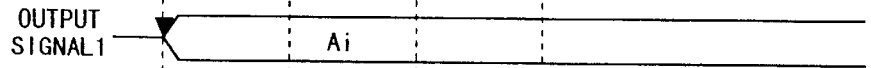
Figure 3I:
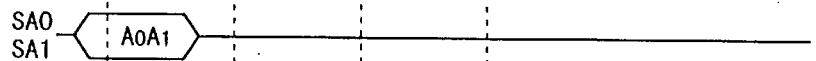
Figure 3J:
Figure 3K:
Figure 3L:
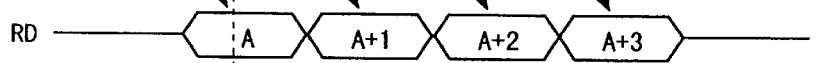
Figure 3M:
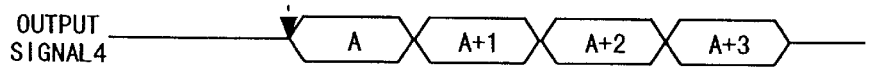
Figure 3N:
Figure 3O:
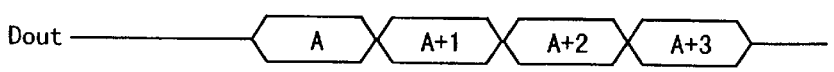

FIGS. 3A through 3O are timing charts showing the relations among the respective signals in the data reading operation in the normal operation of the synchronous semiconductor memory device shown in FIG. 2. FIGS. 3A through 3O show a case where a read signal is inputted simultaneously with the first pulse of the external clock signal.

In the normal operation, in order to read out the data at a specific address of the SRAM core 7 to the outside, a read signal is inputted from the outside at first. That is, the SAC# signal is set to an "L" value, the CE signal is set to an "H" value, and the SGW# signal is set to an "H" value. When the SAC# signal takes an "L" value, the SAC clock signal generator 14 generates an SACCLK signal which includes pulses synchronizing with the external clock signal and is outputted only for the period over which the SAC# signal has an "L" value.

When such signal is inputted, the counter enabling signal generator 4 generates the ADVCLK signal having three pulses synchronizing with the 2nd, 3rd, and 4th pulses of the external clock signal, and inputs the thus generated signal to the operation element 16. Since the external control signal /FT is controlled to an "H" value, the ADVCLK signal itself is outputted from the operation element 16 to the counter 5.

Upon the inputting of the read signal, the counter 5 outputs the externally inputted lowermost place address signal A0A1 to the decoder 6 in synchronism with the SACCLK signal (i.e., in synchronism with the 1st pulse of the external clock signal) Thereafter, the counter 5 generates address signals /A0A1, A0/A1 and /A0/A1 which correspond to the above lowermost place address signal in synchronism with the pulses of the ADVCLK signal (i.e., in synchronism with the 2nd, 3rd, and 4th pulses of the external clock signal). The signals generated in the counter 5 are sequentially outputted to the decoder 6.

That is, as shown in FIG. 3J, the output signal 2 outputted from the counter 5 is sequentially set to A0A1, /A0A1, A0/A1, and /A0/A1 in that order in synchronism with the 1st pulse, 2nd pulse, 3rd pulse, and 4th pulse of the external clock, respectively.

With such operation of the counter 5, mutually related four addresses are sent to the decoder 6 in synchronism with the external clock signal in response to one read signal for data reading purpose.

The decoder 6, based on the address signals A0A1, /A0A1, A0/A1, and /A0/A1 inputted from the counter 5 and an address signal Ai inputted from the address register 2, sequentially generates address signals AiA0A1, Ai/A0A1, AiA0/A1, and Ai/A0/A1 (i.e., output signal 3 in FIG. 3K). Further, the decoder 6 determines memory selection lines in the SRAM core 7 from these addresses, and sends an instruction to read out the data stored at the location corresponding to the selection lines to the SRAM core 7. Upon receipt of the instruction, the SRAM core 7 outputs the data at the corresponding location to the output register 8 via the data bus RD. As a result, as depicted by the output signal RD in FIG. 3L, data A, A+1, A+2, and A+3 which corresponds to the respective addresses are sequentially outputted form the data bus RD.

The output register 8 outputs the data inputted via the data bus RD to the output buffer 10 in synchronism with the external clock signal (i.e., in synchronism with the rise of the 2nd pulse) (output signal 4 in FIG. 3M). The output buffer 10 outputs the data held in the output register 8 to the outside only for the period over which the OE signal remains an "H" value. As illustrated by the output signal OE in FIG. 3N, the OE signal keeps the "H" value for the period from the rise of the 2nd pulse to the rise of the 6th pulse of the external clock signal.

Now, data writing operation in the normal operation will be described. In the data writing operation, data inputted from the outside (i.e., from terminals DQa through DQd, hereinafter collectively referred to as DINDOUT terminal) is inputted to the input register 12 through the input buffer 11 in response to a write signal. The input register 12 inputs the data to the SRAM core 7 in synchronism with the external clock signal. Similar to the data reading process described above, an address for data writing is inputted, whereby the above data is written to this address.

As described above, in the normal operation, by providing an "H" value to the external control signal /FT, data corresponding to a plurality of addresses can be sequentially outputted (or inputted) in synchronism with the external clock signal for one read (or write) signal similar to the synchronous semiconductor memory device shown in FIG. 12. The device according to the first embodiment, therefore, enables a fast data read/write.

Now, a description will be given of the test operation of the synchronous semiconductor device according to the present embodiment.

In the test operation, the externally inputted /FT signal in always controlled to an "L" value. In a case where the /FT signal takes an "L" value, the output signal from the operation element 16 always takes an "L" value and the output signal from the operation element 17 always takes an "L" value as well, while the switch 18a (SW1) is set to an off-state as well as the switch 18b (SW2) is set to an on-state. Under the above condition, the data exchange between the outside and the inside of the synchronous semiconductor memory device can be controlled by the Test OE signal inputted from the outside, thereby enabling an operation similar to the asynchronous semiconductor memory device, i.e., an operation in which only one data is outputted for one read signal as well as the data exchange between the outside and the inside is performed in response to an signal inputted from outside.

Since the device according to the first embodiment operates in a similar manner as that of the asynchronous semiconductor memory device in the test operation, being not able to operate with the timing according to the external clock signal cycle used in the above normal operation in order to ensure a fast operation. Accordingly, the cycle of the external clock signal in the test operation should be made longer than that in the normal operation. Specifically, in the first embodiment, the cycle is set to 5 nsec in the normal operation, and 20 nsec in the test operation.

FIGS. 4A through 4S are timing charts showing the relations among the respective signals in the data reading operation in the test operation of the synchronous semiconductor memory device shown in FIG. 2. FIGS. 4A through 4S show a case where a read signal is inputted simultaneously with the first pulse of the external clock signal.

In the test operation, in order to read out the data at a specific address of the SRAM core 7 to the outside, a read signal is inputted from the outside at first. That is, the SAC# signal is set to an "L" value, the CE signal is set to an "H" value, and the SGW# signal is set to an "H" value. When the SAC# signal takes an "L" value, the SAC clock signal generator 14 generates an SACCLK signal which includes pulses synchronizing with the external clock signal and is outputted only for the period over which the SAC# signal has an "L" value.

When such signal is inputted, the counter enabling signal generator 4 generates the ADVCLK signal having three pulses synchronizing with the 2nd, 3rd, and 4th pulses of the external clock signal, and inputs the thus generated signal to the operation element 16. Since the external control signal /FT is now controlled to an "L" value, the output from the operation element 16 for outputting a result of the logical AND operation between the external control signal /FT and the ADVCLK signal always becomes an "L" value, and thus an "L" value is inputted to the counter 5.

Upon the inputting of the read signal, the counter 5 outputs the externally inputted lowermost place address signal A0A1 to the decoder 6 in synchronism with the SACCLK signal (i.e., in synchronism with the 1st pulse of the external clock signal). In the normal operation, pulses exist in the ADVCLK signal, but the ADVCLK signal always has an "L" value after passing through the operation element 16 in the test operation. Thus, no address signal is generated from the counter 5 in response to the read signal. That is, in the test operation, only the externally inputted lowermost address is outputted from the counter 5 to the decoder 6 (output signal 2 in FIG. 4L).

The decoder 6, based on the address signals A0A1 inputted from the counter 5 and an address signal Ai (i.e., output signal 1 in FIG. 4K) inputted from the address register 2, generates an address signal AiA0A1 (i.e., output signal 3 in FIG. 4M). Further, the decoder 6 determines a memory selection line in the SRAM core 7 from the address, and sends an instruction to read out the data stored at the location corresponding to the selection line to the SRAM core 7. Upon receipt of the instruction, the SRAM core 7 outputs the data at the corresponding location to the output register 8 via the data bus RD. As a result, as depicted by the output signal RD in FIG. 4O, only data A corresponding to the address is outputted form the data bus RD. Incidentally, FIG. 4O shows the outputting of data B corresponding to the address (Aj/A0A1) that is to be outputted for the next read signal.

Since CLK2 is an "L" value, the output register 8 outputs the data inputted via the data bus RD to the output buffer 10 independently of the external clock signal. The output register 8 will be described later in detail. The output buffer 10 outputs the data held in the output register 8 to the outside according to the Test OE signal.

As mentioned above, the external control signal /FT always takes an "L" value in the test operation. Accordingly, the switch 18a (SW1) is brought into an off-state as well as the switch 18b (SW2) is brought into an on-state. In this case, the externally inputted Test OE signal causes the output buffer 10 to output the data held in the output register 8 to the outside. In addition, since this Test OE signal is inputted from the outside, the Test OE signal may be any signal which is not synchronized with the external clock signal, and thus the inputting/outputting of data between the outside and the inside of the synchronous semiconductor memory device can be freely performed.

In a data writing operation, upon receipt of a write signal, data inputted from the outside (i.e., from the DINDOUT terminal) is inputted to the input register 12 according to the Test OE signal. In this operation, the input register 12 inputs the data to the SRAM core 7 independently of the external clock signal. Then, a writing location is inputted in a manner similar to the reading operation described above, and the data is written to this location. Further, output buffer 10 outputs data from the inside to the outside when the Test OE signal is at an "H" value, but, conversely, the input buffer 12 inputs data from the outside to the inside when the Test OE signal is at an "L" value.

Now, the output register 8 of the synchronous semiconductor memory device shown in FIG. 2 is described.

Figure 5:
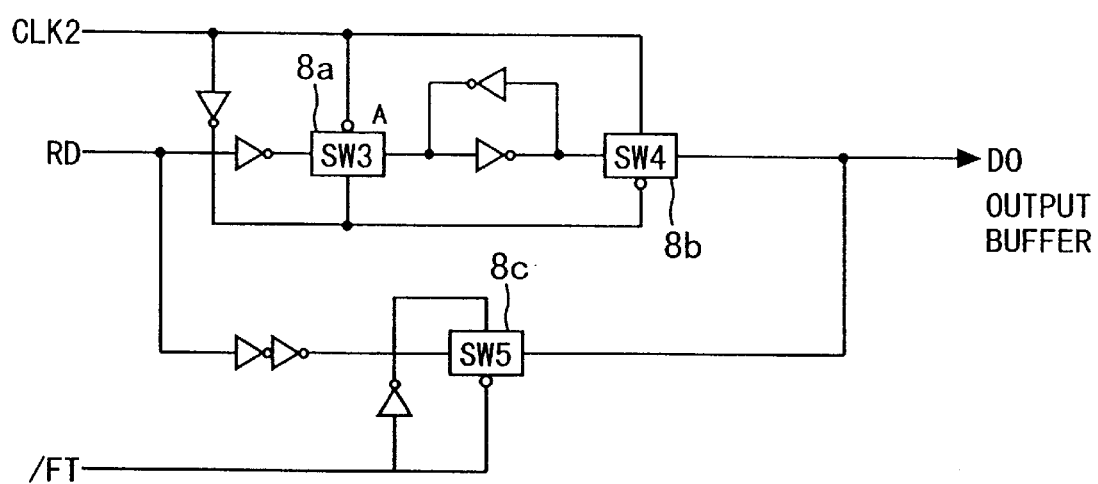
FIG. 5 is a circuit diagram showing a output register provided in the synchronductor memory device shown in FIG. 2.
Figure 7A:
FIGS. 7A through 7J are timing charts for describing a normal objection and a test purpose operation of the synchronous semiconductor memory device shown in FIG. 2.
Figure 7B:
Figure 7C:
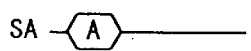
Figure 7D:
Figure 7E:
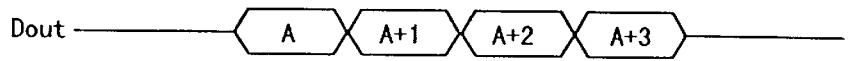
Figure 7F:
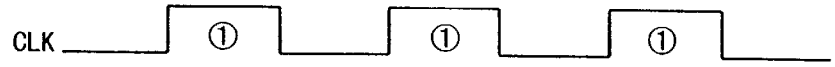
Figure 7G:
Figure 7H:
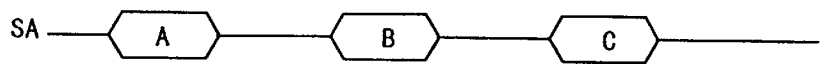
Figure 7I:
Figure 7J:
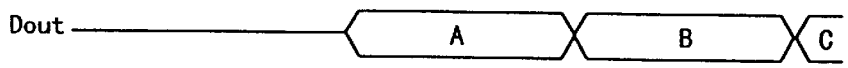

FIG. 5 is a circuit diagram showing the output register 8 of the synchronous semiconductor memory device shown in FIG. 2. In the figure, reference numerals 8a, 8b, and 8c designate switches changeable to an on-state or off-state by CLK2 or the external control signal /FT.

FIGS. 6A through 6M are timing charts showing the relations among the various signals for explaining the operation of the output register shown in FIG. 5. Particularly, FIGS. 6A through 6G show the relations among the various signals in the normal operation, while FIGS. 6H through 6M show the relations among the various signals in the test operation. When the external control signal /FT is at an "H" value as shown in FIG. 6B (i.e., in the normal operation), the switch 8c (SW5) is put in an off-state, whereby no data inputted from RD is outputted to Do through the switch 8c (SW5).

In this process, since the pulse signal of CLK2 repeatedly outputs "H" and "L" values, the switch 8a (SW3) and the switch 8b (SW4) alternately repeat the on- and off-states. During the operation, when CLK2 becomes an "L" value and the switch 8a (SW3) turns on, the data outputted from RD is sent through the switch 8a (SW3) to the inverter between the switches 8a (SW3) and 8b (SW4). The data, after being temporarily held by the inverter, is outputted from Do through the switch 8b (SW4) when CLK2 becomes an "H" value and the switch 8b (SW4) turns on. That is, in the normal operation, the signal is outputted from RD in synchronism with CLK2.

In the test operation, since the CLK2 signal is caused to always take an "L" value by the operation element 17 as shown in FIG. 6I, the switch 8b (SW4) always stays at an off-state, so the data outputted from RD is not outputted from Do through the switches 8a (SW3) and 8b (SW4). The external control signal /FT always has an "L" value at this stage, and thus the switch 8c (SW5) is always in an on-state, whereby the data outputted from RD is outputted from Do through the switch 8c (SW5). Accordingly, in the test operation, the signal outputted from RD can be directly outputted to Do without being synchronized with the clock signal.

As described above, when the external control signal /FT is set to the "L" value in the test operation, the synchronous semiconductor memory device according to the first embodiment operates in a similar manner to the asynchronous semiconductor memory device (i.e., in a manner outputting the data corresponding to one address for one read signal). Accordingly, with the first embodiment, a test can be made for any address, and the test pattern used in the former general-purpose asynchronous semiconductor memory device may be employed.

FIGS. 7A through 7J are timing charts showing the signals in the normal and test operations of the synchronous semiconductor memory device shown in FIG. 2. More particularly, FIGS. 7A through 7E show the signals in the normal operation, while FIG. 7F through 7J show the signals in the test operation. As shown in FIGS. 7A through 7E, in the normal operation, four pieces of data A, A+1, A+2, and A+3 corresponding to an externally inputted address signal A are sequentially and continuously outputted for one read signal (i.e., for the "L" value of SAC#). Further, in this operation, the output enabling signal OE remains at an "H" value for a period from the rise of the 2nd pulse to the rise of the 6th pulse of the external clock signal, during which period the data is outputted to the outside.

On the other hand, in the test operation, as shown in FIGS. 7F through 7J, only one piece of data A corresponding to the externally inputted address signal A is outputted for one read signal (i.e., for the "L" value of SAC#). Thereafter, in the test operation, for the next read signal and the read signal successive to it, only respective one piece of data B and C corresponding to the externally inputted address signals B and C are outputted. In addition, the externally inputted Test OE signal is used as the signal for controlling the data exchange between the outside and the inside in the test operation. The Test OE signal can be made an "H" or "L" value with any timing, whereby the timing of the inputting/outputting of data can be controlled with any timing.

In this embodiment, an example has been shown in which the assembling is made in a QFP package. However, the present invention is not limited to the embodiment. The assembling can be made in other packages such as TQFP.

Further, in this embodiment, the operation similar to that of the asynchronous semiconductor memory device is performed in the test operation by controlling the external control signal /FT. however, the present invention is not limited to that embodiment. If an operation similar to the asynchronous semiconductor memory device is required, the operation may be carried out by controlling the external control signal /FT even in an operation other than the test operation.

As mentioned previously, the first embodiment enables to perform the normal operation and the test operation according to the external control signal. Particularly, the first embodiment in the normal operation sequentially outputs (or inputs) data corresponding to a plurality of mutual related addresses in synchronism with the external clock signal for one read (or write) signal. Further, the first embodiment in the test operation outputs (or inputs) data corresponding to only one address in response to the externally input signal for one read (or write) signal. The first embodiment, therefor, enables high speed read/write operation in the normal operation, as well as a test for respective addresses and utilization of the test patterns or the like used in the asynchronous semiconductor memory device in the test operation.

Second Embodiment

In the first embodiment mentioned above, the result of the logical AND operation between the external control signal /FT and the ADVCLK signal generated in the counter enabling signal generator 4 is inputted to the counter 4. In contrast, the second embodiment inputs a result of the logical AND operation between the external control signal /FT and the signal which would be directly inputted to the counter enabling signal generator 4 in the first embodiment. Since the remaining portions are similar to the first embodiment, the description of them will be omitted.

Figure 8:
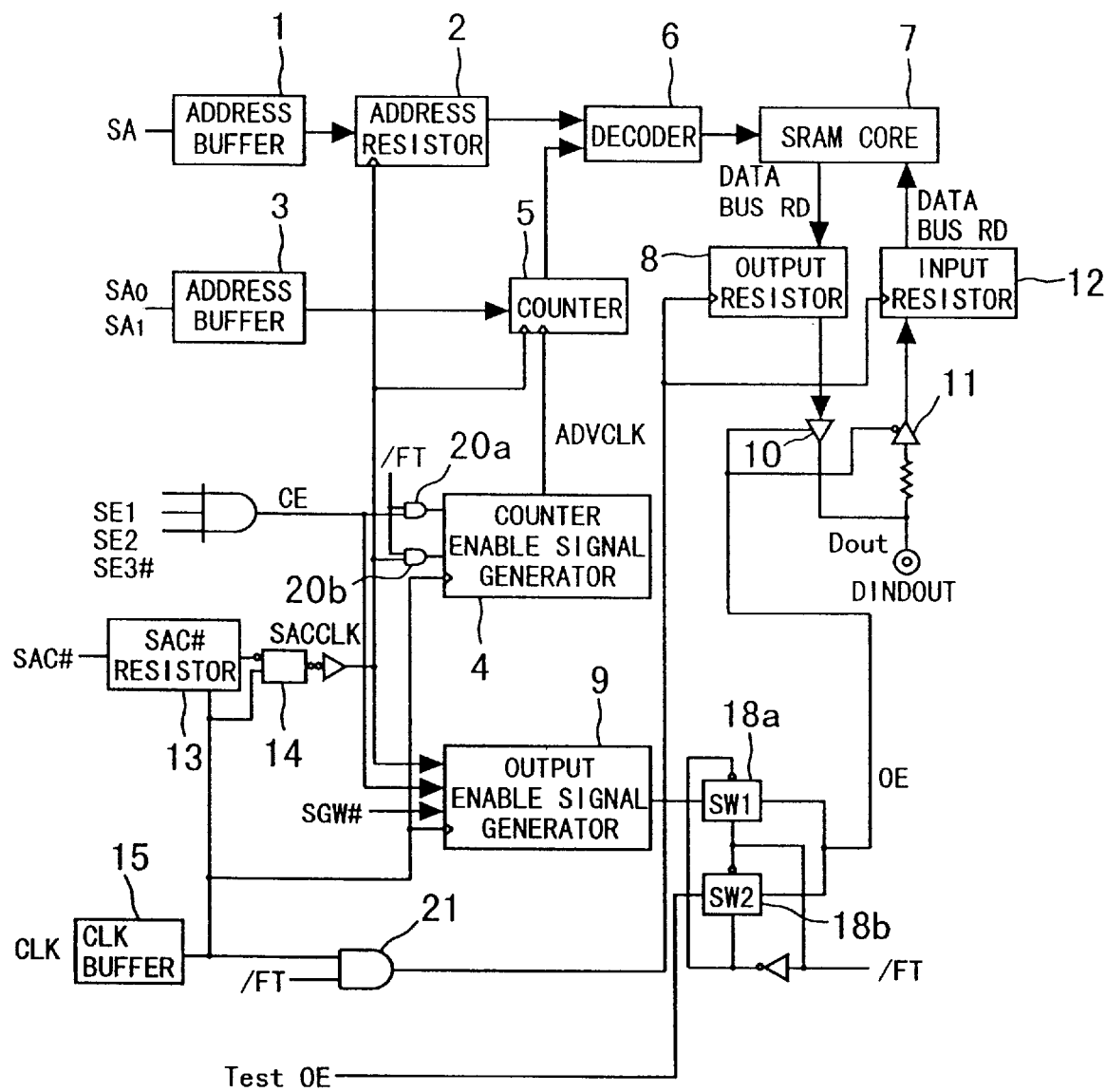
FIG. 8 is a circuit diagram of a synchronous semiconductor memory device practiced as a second embodiment of the present invention.

FIG. 8 is a circuit diagram showing the synchronous semiconductor memory device practiced as the second embodiment. In FIG. 8, reference numeral 20a designates an operation element for outputting a result of the logical AND operation between the CE signal and the external control signal /FT to the counter enabling signal generator 4. Reference numeral 20b designates an operation element for outputting a result of the logical AND operation between the SACCLK signal and the external control signal /FT to the counter enabling signal generator 4. Reference numeral 21 designates an operation element outputting a result of the logical AND operation between the external clock signal and the external control signal /FT to the output register 8 and the input register 12. Since the remaining portions are similar to that shown in FIG. 2, the description of them is omitted.

The operation of the second embodiment will be now described.

In the normal operation, the external control signal /FT is set to an "H" value. Then, the operation elements 20a, 20b, and 21 output the CE signal, SACCLK signal, and external CLK signal, respectively, and an operation completely similar to that in the normal operation described in the first embodiment is performed.

In the test operation, the external control signal /FT is set to an "L" value. In this case, since the CE signal and the SACCLK signal, which are inputted to the counter enabling signal generator 4, are both set to an "L" value by the operation elements 20a and 20b, the counter enabling signal generator 4 does not generate the ADVCLK signal synchronizing with the external clock signal even if a data read signal (data write signal) is inputted from the outside. Thus, the counter 5 outputs only the lowermost place address inputted from the outside in synchronism with the SACCLK signal to the decoder 6. Accordingly, an operation similar to that in the test operation described in the first embodiment is performed.

Further, although, in the first embodiment 1, operation element 17 outputs the result of the logical AND operation between the external clock signal and the external control signal /FT to the CLK buffer 15, the second embodiment input a result of the logical AND operation between the output of the CLK buffer 15b and the external control signal /FT to the input and output registers 8 and 12 instead of the operation element 17. The second embodiment, despite of the deference of the structure, enable a similar operation to that of the first embodiment.

As mentioned previously, the second embodiment enables to perform the normal operation and the test operation, according to the external control signal. Particularly, the second embodiment in the normal operation sequentially outputs (or inputs) data corresponding to a plurality of mutual related addresses in synchronism with the external clock signal for one read (or write) signal. Further, the second embodiment in the test operation outputs (or inputs) data corresponding to only one address in response to the externally input signal for one read (or write) signal. The second embodiment, therefor, enables high speed read/write operation in the normal operation, as well as a test for respective addresses and utilization of the test patterns or the like used in the asynchronous semiconductor memory device in the test operation.

Third Embodiment

In the first embodiment mentioned above, a pin is provided for inputting the Test OE signal use only, and the Test OE signal is inputted through the pin. In contrast, the third embodiment uses an existing pin for inputting the Test OE signal during the test operation without newly providing a pin for the Test OE signal.

Figure 9:
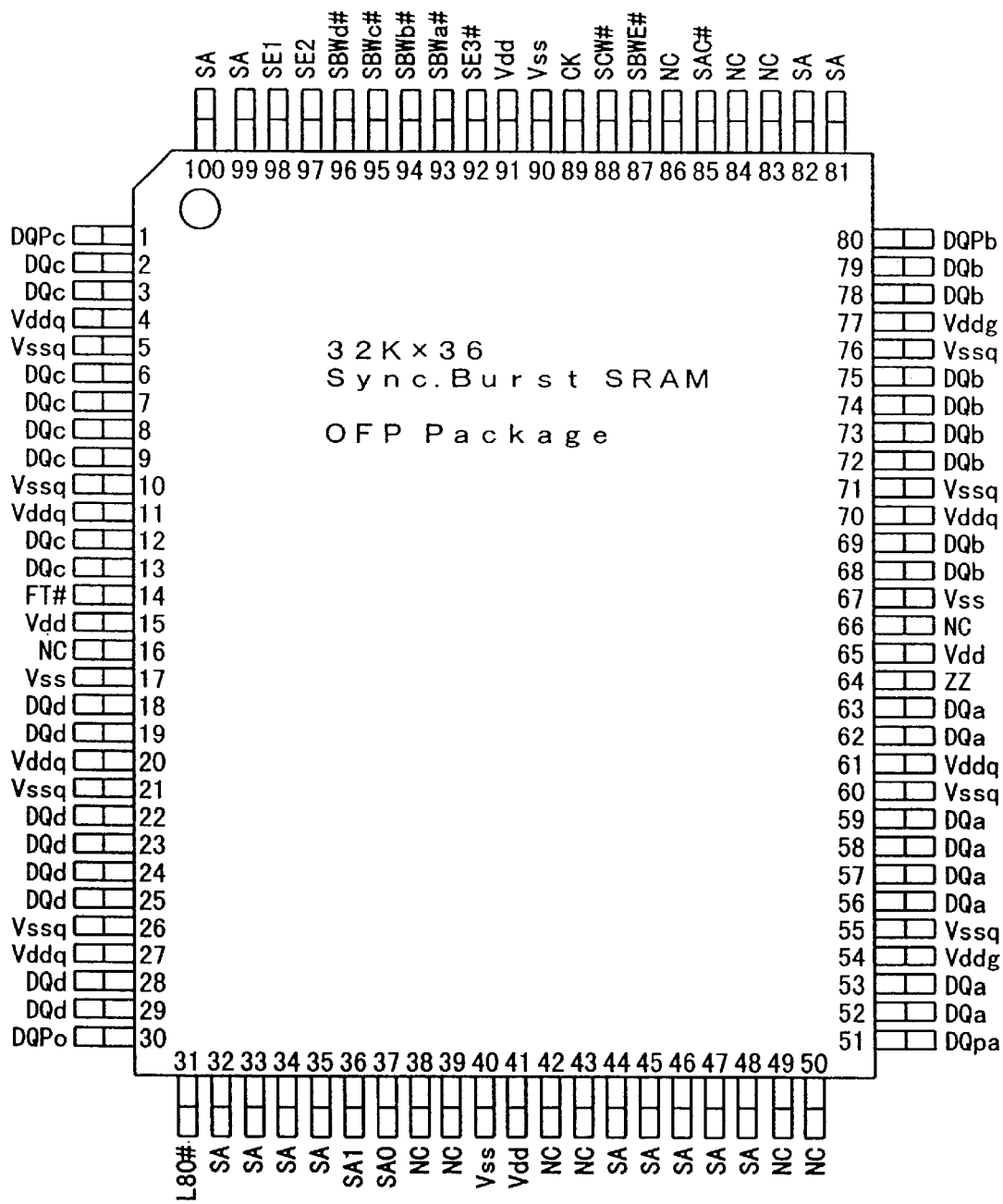
FIG. 9 is a plane view of a synchronous semiconductor memory device practiced as a third embodiment of the present invention.

FIG. 9 is a plane view of a QFP package of the synchronous semiconductor memory device practiced as the third embodiment of the present invention. As shown in FIG. 9, this package is provided with terminals Vdd and Vddq to which a power supply signal is inputted, Vss and Vssq to which a ground signal is inputted, a terminal ZZ for inputting a signal for controlling the on-off state of all the input buffers, terminals SA0 and SA1 to which lowermost place address signals are inputted, a terminal SA to which an address signal is inputted, terminals DQa, DQb, DQc, and DQd for inputting/outputting a data signal, terminals SE1, SE2, and SE3# to which a chip enable signal is inputted, and terminal FT# for inputting an external signal for controlling the data read/write format, respectively. In addition, there is not provided a terminal for inputting the Test OE signal for controlling the data exchange between the outside and the inside of the package, such as that shown in FIG. 1.

FIG. 10 is a circuit diagram showing a part of the inside of the package of the synchronous semiconductor memory device shown in FIG. 9. In FIG. 10, reference numeral 31 designates an input buffer for holding the signal inputted from the terminal ZZ shown in FIG. 9, and inputting it to the inside of the device. Reference numeral 32a designates a switch (SW6) which turns on when the external control signal /FT has an "H" value, and turns off when the external control signal /FT has an "L" value. Reference numeral 32b designates a switch (SW7) which turns on when the external control signal /FT has an "L" value, and turns off when the external control signal /FT has an "H" value. Reference numeral 33a designates a transistor having one end connected to a predetermined power supply and the other end connected to INTZZ, for causing the predetermined power supply to be connected to INTZZ when the external control signal /FT is at an "L" value. Further, reference numeral 33b designates a transistor having one end connected to Test OE and the other end grounded, for causing Test OE to be grounded when the external control signal /FT is at an "H" value.

FIGS. 11A through 11H are timing charts showing the relations among the various signals for explaining the operation of the synchronous semiconductor memory device shown in FIG. 10. Particularly, FIGS. 11A through 11D show the relations among the various signals in the normal operation (i.e., in a case where the external control signal /FT is at "H"), whereas FIGS. 11E through 11H shows the relations among the various signals in the test operation (i.e., in a case where the external control signal /FT is at "L").

Since the external control signal /FT always has an "H" value in the normal operation, as shown in FIG. 11B, the switch 32a (SW6) shown in FIG. 10 becomes an on-state whereas the switch 32b (SW7) shown in FIG. 10b ecomesan off-state. Thus, the signal inputted from the ZZ terminal is inputted to INTZZ via the input buffer 31 and SW6 (see FIGS. 11A and 11C). Conversely, the Test OE signal always stays at an "L" value because the switch 32b (SW7) is at an off-state. Further, at this stage, Test OE is grounded by the transistor 33b and fixed stably to an "L" value.

As shown in FIG. 11F, the external control signal /FT always has an "L" value in the test operation. Thus, the switch 32a (SW6) shown in FIG. 10 is put in an off-state while the switch 32b (SW7) shown in FIG. 10 is put in an on-state. As a result, the signal inputted from the ZZ terminal is intercepted by SW6, and is not inputted to INTZZ (see, FIGS. 11E and 11G). In this stage, INTZZ is connected to the predetermined power supply by the transistor 33a thereby stably fixed to an "H" value. In contrast, the signal inputted from the ZZ terminal becomes the Test OE signal through the switch 32b (SW7) because SW7 is at an on-state, thereby enabling an inputting of the Test OE signal from the ZZ terminal.

As mentioned previously, the third embodiment enables inputting of the Test OE signal from the existing pin in the test operation, whereby a synchronous semiconductor memory device can be efficiently implemented without newly providing a pin for Test OE signal inputting purpose.

The major benefits of the present invention described above are summarized as follows:

According to the first aspect of the present invention, a synchronous semiconductor memory device sequentially reads out from or writes to a memory cell respective data corresponding to a plurality of addresses in synchronism with a clock signal for one read signal or one write signal. The synchronous semiconductor memory device includes a control circuit by which control can be executed according to an externally inputted control signal so that only the data corresponding to one address is outputted from the memory cell or inputted to the memory cell for the above one read signal or the above one write signal. Thus, not only a fast read/write operation but also a read/write operation for an individual address can be performed.

According to the second aspect of the present invention, the synchronous semiconductor memory device further includes an address output unit for sequentially outputting a plurality of addresses in synchronism with a clock signal for one read signal or one write signal. Further, the control circuit can control the address output unit so as to output only one address for the above one read signal or the above one write signal. Thus, the device in the normal operation enables a high speed read/write operation, by outputting or taking a plurality of date at once for the one read or write signal, while the device in the test operation outputs or takes data corresponding to only one address for one data read or write signal, thereby enabling a test for an individual address as well as the utilization of the test pattern or the like used for the asynchronous semiconductor memory device.

According to the third aspect of the present invention, the synchronous semiconductor memory device also includes an input/output circuit for controlling the data input/output between the memory cell and the outside according to an output enabling signal which is externally inputted. Thus, the device enables to control the data exchange between the outside and the inside of a semiconductor chip with any timing independently of the clock signal.

According to the fourth aspect of the present invention, the synchronous semiconductor device further includes an input terminal for taking the output enabling signal from the outside. With the device, the output enabling signal can be inputted from the outside, thereby enabling the data exchange between the outside and the inside of the semiconductor chip to be controlled with any timing.

According to the fifth aspect of the present invention, the output enabling signal is allowed to be inputted from the existing terminal when an predetermined control is performed by an external control signal. The device can be implemented without newly providing a pin for inputting a Test OE signal, whereby a efficient productivity is ensured.

According to the sixth aspect of the present invention, an input terminal is provided for inputting the externally inputted control signal. The control, therefore, for controlling the device to operate as a synchronous semiconductor memory device or to operate as an asynchronous semiconductor memory device can be performed from outside of the same.

Further, the present invention is not limited to these embodiments, but variations and modifications may be made without departing from the scope of the present invention.

The entire disclosure of Japanese Patent Application No. Hei 10-238767 filed on Aug. 25, 1998 including specification, claims, drawings and summary are incorporated herein by reference in its entirety.

What is claimed is:

1. A semiconductor device comprising:

a memory core in which data are stored;

an address generator generating a plurality of addresses sequentially for one read signal or one write signal, respective data corresponding to the plurality of addresses being read out from or written into said memory core in synchronism with a first clock signal, and a control circuit, by which control can be executed according to an external control signal so that said address generator generates only one of said plurality of addresses for said one read signal or said one write signal.

2. The semiconductor memory device according to claim 1, wherein said address generator includes a counter setting one received address in synchronism with a second clock signal and counting sequentially from the one receiving address in synchronism with a third clock signal, and said control circuit stops supplying said counter with the third clock signal according to said control signal.

3. The semiconductor device according to claim 2, further comprising:

an enable signal generator generating a first enable signal according to the second clock signal;

a selection circuit selecting and outputting, according to the control signal, one of the first enable signal output from said enable signal generator and a second enable signal different from the first enable signal; and an output buffer receiving and outputting data read out from said selection circuit.

4. The semiconductor memory device according to claim 1, further comprising:

an enable signal generator generating a first enable signal according to a clock signal applied from an external of said memory device;

a selection circuit outputting the first enable signal output from said enable signal generator when said control signal is negated and outputting a second enable signal different from the first enable signal when said control signal is asserted; and an output buffer receiving and outputting data read out from said memory core in accordance with the one enable signal output from said selection circuit.

5. The semiconductor memory device according to claim 1, further comprising:

an output register connected to said memory core and holding said plurality of data values in synchronism with said first clock signal, said output register outputting, in response to said control signal, a data value received from said memory without being synchronous with the first clock signal.

6. A semiconductor memory device comprising:

a memory core in which data are stored;

an address generator generating a plurality of addresses sequentially in accordance with one address received thereby, said memory core outputting a plurality of data values stored therein corresponding to the plurality of addresses;

a control circuit responsive to a control signal and controlling said address generator to generate only one of the plurality addresses in response to the received one address; and an output register connected to said memory core and holding said plurality of data values in synchronism with a clock signal, said output register outputting, in response to said control signal, a data value received from said memory core without being synchronous with the clock signal.

7. The semiconductor memory device according to claim 6, wherein said address generator includes a counter setting one received address in synchronism with a first signal and counting sequentially from the one receiving address in synchronism with a second clock signal, and said control circuit stops supplying said counter with the second clock signal according to said control signal.

8. The semiconductor memory device according to claim 7, further comprising:

an enable signal generator generating a first signal according to the first lock signal;

a selection circuit selecting and outputting, according to the control signal, one of the first enable signal output from said enable signal generator and a second enable signal different from the first enable signal; and an output buffer outputting data received from said output register in accordance with the one enable signal output from said selection circuit.

9. The semiconductor memory device according to claim 6, further comprising:

an enable signal generator generating a first signal according to a clock signal applied from an external of said memory device;

a selection circuit outputting the first enable signal output from said enable signal generator when said control signal is negated and outputting a second enable signal different from the first enable signal when said control signal is asserted; and an output buffer outputting data received from said output register in accordance with the one enable signal output from said selection circuit.

* * * * *